United States Patent
Farooqi

(10) Patent No.: US 6,329,941 B1
(45) Date of Patent: Dec. 11, 2001

(54) DIGITAL-TO-ANALOG CONVERTING DEVICE AND METHOD

(75) Inventor: Neaz E. Farooqi, Colorado Springs, CO (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/313,749

(22) Filed: May 27, 1999

(51) Int. Cl.$^7$ .................................................. H03M 1/66
(52) U.S. Cl. ........................ 341/145; 341/144; 341/153; 341/154
(58) Field of Search ...................... 341/118, 135, 341/145, 154, 153, 144

(56) References Cited

U.S. PATENT DOCUMENTS

| | | | |
|---|---|---|---|
| 4,016,555 | * 4/1977 | Tyrrel | 341/145 |
| 4,935,740 | * 6/1990 | Schouwenhaars et al. | 341/135 |
| 4,967,140 | * 10/1990 | Groeneveld et al. | 341/144 |
| 5,057,838 | * 10/1991 | Tsuji et al. | 341/133 |
| 5,153,592 | * 10/1992 | Fairchild et al. | 341/118 |
| 5,243,347 | 9/1993 | Jackson et al. | 341/144 |
| 5,270,716 | 12/1993 | Gleim | 341/145 |
| 5,283,580 | 2/1994 | Brooks et al. | 341/145 |
| 5,321,401 | * 6/1994 | White | 341/147 |
| 5,446,457 | 8/1995 | Ryat | 341/136 |
| 5,451,946 | 9/1995 | Smith et al. | 341/118 |
| 5,666,118 | 9/1997 | Gersbach | 341/120 |
| 5,703,587 | * 12/1997 | Clark et al. | 341/144 |
| 5,801,655 | 9/1998 | Imamura et al. | 341/145 |

OTHER PUBLICATIONS

Falakshahi, et al., "A 14–bit, 10–Msamples/s D/A Converter using Multibit ΣΔ Modulation", IEEE Journal of Solid State Circuits, vol. 34, No. 5, May 1999, pp. 607–615.

Groeneveld, et al., "A Self–Calibration Technique for Monolithic High–Resolution D/A Converters", IEEE Journal of Solid State Circuits, vol. 24, No. 6., Dec. 1989, pp. 1517–1522.

Vandenbussche, et al., "A 14b 150MSamples/s Update Rate $Q^2$ Random Walk CMOS DAC", 1999 IEEE International Solid–State Circuits Conference, pp. 146–149, Feb. 161, 1999.

Schoeff, John A., "An Inherently Monotonic 12 Bit DAC", IEEE Journal of Solid State Circuits, vol. SC–14, No. 6, Dec. 1979, pp. 904–911.

Schouwenaars, et al., "A Low–Power Stereo 16–bit CMOSD/A Converter for Digital Audio" IEEE Journal of Solid State Circuits, Vo. 23, No. 6, Dec. 1988, pp. 1290–1297.

\* cited by examiner

Primary Examiner—Michael Tokar
Assistant Examiner—Steven S. Paik
(74) Attorney, Agent, or Firm—Lisa K. Jorgenson; Andre Szuwalski

(57) ABSTRACT

A digital-to-analog converter (DAC) having a first sub-DAC for generating a coarse current level based upon the most significant bits of the digital input signal, and a second sub-DAC for generating a fine current level in response to the least significant bits of the digital input signal. The first sub-DAC is segmented, including a plurality of equally-sized current sources and self-calibration circuitry for calibrating the equally-sized current sources concurrently with generating the coarse current level. The second sub-DAC is itself partially segmented, wherein a first portion of the second sub-DAC includes a plurality of equally-sized current sources and a thermometer decoder associated therewith. The second sub-DAC further includes a plurality of binary-weighted current sources. Current levels generated by the first and second sub-DACs are summed to generate an analog equivalent of the digital input signal.

27 Claims, 2 Drawing Sheets

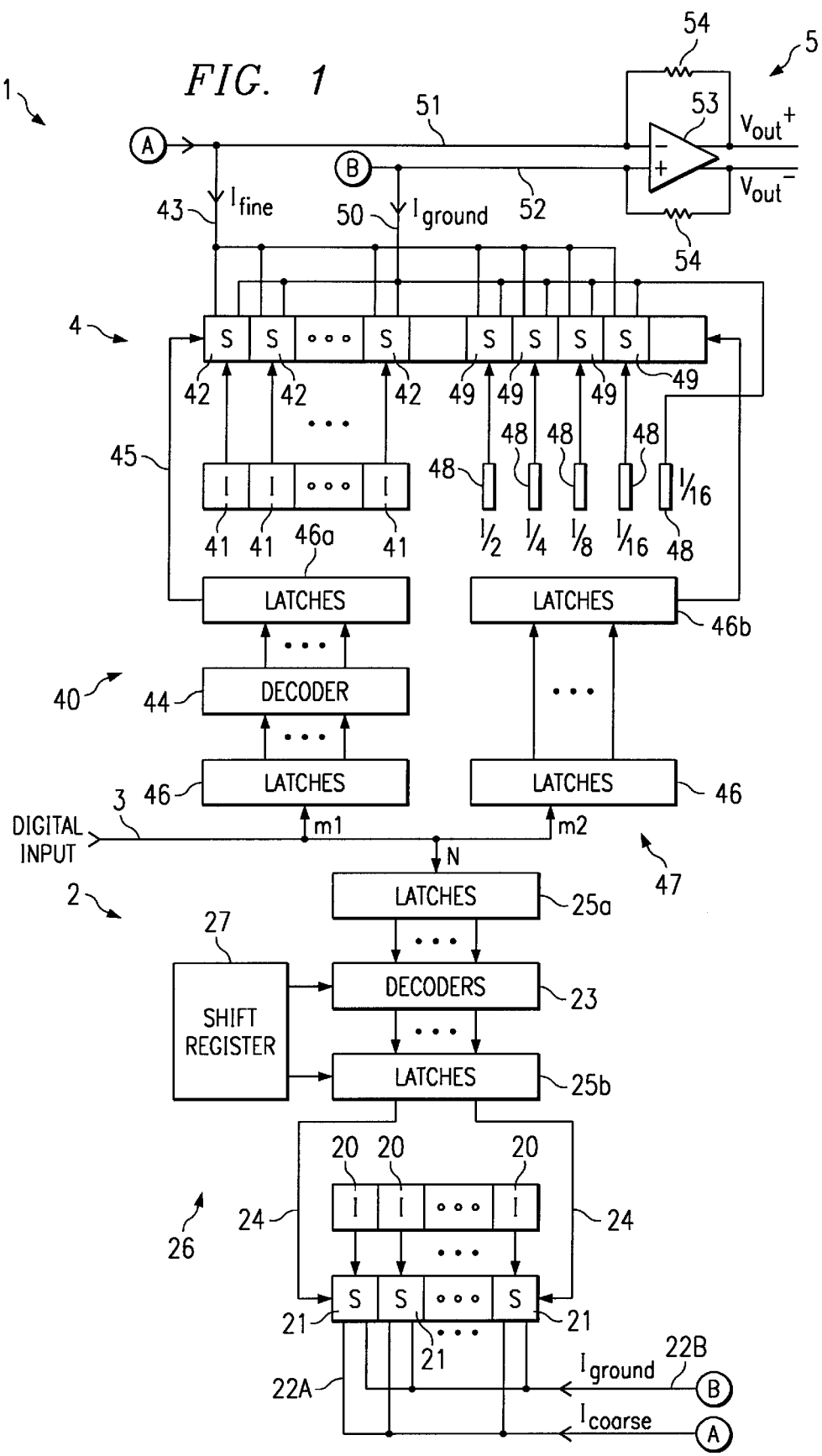

DIGITAL-TO-ANALOG CONVERTING DEVICE AND METHOD

BACKGROUND OF THE INVENTION

1. Technical Field of the Invention

The present invention relates to a digital-to-analog converter (DAC), and more particularly to a DAC having a partially segmented sub-DAC.

2. Background of the Invention

Digital-to-analog conversion is the process of converting a signal in digital form into a signal in analog form. Digital-to-analog converters (DACs) typically convert a digital code to an analog voltage by assigning a voltage weight or current weight to each bit in the digital code and summing the voltage or current weights corresponding to each of the bits of the digital code.

There are two types of DACS, binary weighted DACs and segmented DACs. Binary weighted DACs are typically implemented as a network of resistors and switches which are selectively activated by the bits of the digital code so as to selectively accumulate a series of currents which are summed by an amplifying circuit. Purely binary weighted DACs generally are not used in high performance applications due to relatively high process variations between the resistors in the resistor network and particularly to the difficulty in proportionally matching resistors of substantially vastly different sizes in the resistor network.

Segmented DACs are an attempt to improve the performance over purely binary weighted DACs. In general terms, a segmented DAC converts the digital input code into a plurality of signals which drive equally weighted current sources.

There are known DACs which combine binary weighted and segmented architectures. For example, a 12-bit partially segmented DAC, i.e., a DAC which is partitioned such that a first DAC portion is segmented and a second DAC portion is binary weighted, is disclosed in "An Inherently Monotonic 12 Bit DAC" by John Schoeff, IEEE Journal of Solid State Circuits, vol. 14. no. 6 (December 1979) and incorporated herein by reference. The three most significant bits (MSBs) of the digital input word are input to an eight segment sub-DAC which is capable of generating any of eight coarse current levels. The nine least significant bits (LSBs) of the digital input word are fed to a binary weighted sub-DAC which is capable of generating any of 512 distinct fine current levels within each of the eight coarse current levels.

A second partially segmented DAC is described in "A Low Power Stereo 16-bit CMOS D/A Converter for Digital Audio" by Hans Schouwenaars et al., IEEE Journal of Solid State Circuits, vol. 23, no. 6 (December 1988). This 16-bit DAC includes a segmented sub-DAC having a plurality of equally-sized coarse current sources which are applied to a set of three-way current switches. A decoder transforms the binary input code of the 6 MSBs into a thermometer code which controls the coarse current switches. One of the coarse current sources is connected by the three-way switches to a divider stage which divides the applied current into binary weighted fine current levels. The fine binary-weighted currents, generated by a binary weighted sub-DAC corresponding to the 10 LSBs of the digital input code, are switched to the output by two-way current switches controlled thereby. The coarse and fine currents are summed and converted into a voltage by an amplifying circuit.

Although segmented DACs typically have improved linearity with respect to DACs having binary weighted architectures, segmented DACs nevertheless often fail to achieve the linearity requirements demanded by today's high performance applications. Calibration techniques thus exist for improving the performance of segmented DACs, such as improving the linearity thereof.

One calibration technique in DAC designs is laser trimming which more closely matches resistor values in a DAC so as to improve the linearity thereof. Another calibration technique is self-calibration in which a plurality of stored charges which control the operating characteristics of the current sources within a DAC are periodically calibrated to ensure that current levels generated by the current sources are equally or proportionally matched to each other. One such self-calibration technique, described in "A Self-Calibration Technique for Monolithic High Resolution D/A Converters", by D. Wouter J. Groeneveld et al., IEEE Journal of Solid State Circuits, vol. 24, no. 6 (December 1989) and incorporated herein by reference, utilizes N+1 equally-sized current sources for generating N useable current sources. Specifically, the technique includes a serial shift register which sequentially calibrates the current sources of the DAC. The current sources which are not being calibrated are enabled to form the current sources of a segmented sub-DAC of the 16-bit DAC. The current source which is being calibrated is shifted out of the DAC so that it is unusable. By sequentially disabling a current source for calibration while the remaining current sources remain enabled to perform a conversion operation, no calibration time is necessary.

Despite the performance gains achieved by the above-identified DAC architectures, there exists a need for a DAC having improved linearity, high dynamic range and reduced power and size.

SUMMARY OF THE INVENTION

The present invention overcomes limitations and shortcomings of existing DAC designs and satisfies a significant need for a DAC which provides an improved performance. The DAC, according to the present invention, includes a first sub-DAC having a segmented architecture, including equally-sized current sources and current switches connected thereto which are controlled by a decoded version of the MSBs of the digital input signal. With the first sub-DAC being fed by, for example, the first four MSBs of the digital input signal, the first sub-DAC can generate any of 16 coarse current levels.

The first sub-DAC preferably is also a trimmable DAC by including self-calibration circuitry so that the equally-sized current sources are calibrated to closely match each other. The self-calibration circuitry includes a cyclic serial shift register which sequentially disables a single current source for calibration while the remaining current sources which are not disabled remain available for performing a conversion operation.

The DAC, according to the present invention, further includes a second sub-DAC which is capable of generating any of a number of fine current levels between successive coarse current levels generated by the first sub-DAC. The second sub-DAC preferably is itself partially segmented, including a plurality of equally-sized current sources whose currents are selectively steered and accumulated by the MSBs of the digital input signal which are not input to the first sub-DAC. The second sub-DAC further includes a binary-weighted current divider which is controlled by the LSBs of the digital input signal of the DAC. The current output levels from the first sub-DAC and the second sub- DAC are added together by an amplifying circuit to generate an output voltage signal which is an analog version of the digital input signal of the DAC.

BRIEF DESCRIPTION OF THE DRAWINGS

A more complete understanding of the system and method of the present invention may be obtained by reference to the following Detailed Description when taken in conjunction with the accompanying Drawings wherein:

FIG. 1 is a block diagram of a digital-to-analog converter according to a preferred embodiment of the present invention;

DETAILED DESCRIPTION OF THE PREFERRED EXEMPLARY EMBODIMENTS

Figure 2A:
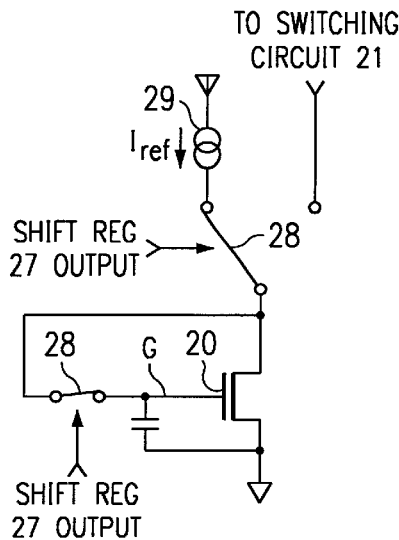
FIGS. 2A and 2B are block diagrams of a sub-circuit of the digital-to-analog converter illustrated in FIG. 1.

Referring to FIGS. 1 and 2, there is shown a digital-to-analog converter (DAC) 1 according to the present invention, including a first sub-DAC 2 which generates one of a plurality of coarse current levels based upon the most significant bits (MSBs) of the digital input signal 3, a second sub-DAC 4 which generates one of a plurality of fine current levels within any of the coarse current levels generated by first sub-DAC 2, and a summing circuit 5 for adding the generated coarse current level and the generated fine current level and producing an analog voltage level therefrom which is the analog equivalent of digital input signal 3.

First sub-DAC 2 preferably is segmented, having a plurality of equally sized current sources 20. The number of current sources 20 is based in part upon the N MSBs of digital input signal 3 which are used as inputs to first sub-DAC 2. Each current source 20 preferably sources a current level which is substantially equal to the current levels sourced by the other current sources 20.

First sub-DAC 2 further includes a plurality of switching circuits 21, each of which is connected to a distinct current source 20. Switching circuits 21 are controllable to steer the currents sourced by current sources 20 to either a summation node 22A or a reference supply node 22B, such as ground.

Decoders 23 are included in first sub-DAC 2 and receive the N MSBs of digital input signal 3 and control signals from shift register 27, and generates decoded signals 24. Each decoded signal 24 controls a switching circuit 21 so that the current sourced by the corresponding current source 20 is selectively steered to summation node 22 based upon the value of the decoded signal 24. In this way, summation node 22 of first sub-DAC 2 accumulates equally sized currents for generating a current level $I_{coarse}$ of a plurality of discrete coarse current levels based upon the digital input to decoders 23.

First sub-DAC 2 preferably further includes latches 25a and 25b which temporarily store the N MSBs of digital input signal 3 that are inputs to decoders 23 and the output signals thereof, respectively.

In order to improve the linearity of DAC 1, first sub-DAC 2 preferably includes self-calibration circuitry 26 for substantially continuously calibrating current sources 20 without the need for a calibration cycle. In a preferred embodiment of the present invention, self-calibration circuitry 26 includes a cyclic shift register 27 which generates a plurality of output signals, each of which is connected to decoders 23 and to a distinct switching circuit 21 via latches 25b so as to selectively enable the corresponding current source 20 for participating in a converter operation.

Figure 2B:
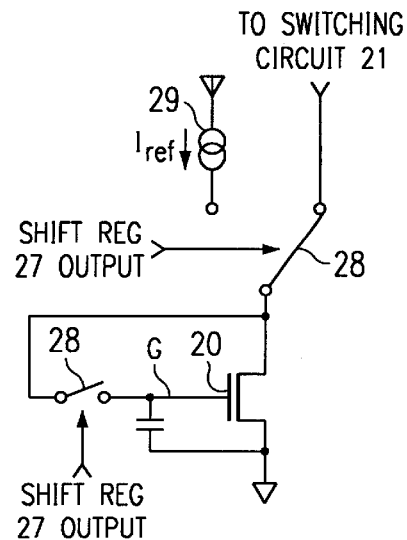

Specifically, each current source 20 and corresponding switching circuit 21 includes circuitry 28 (FIGS. 2A and 2B) for disconnecting and/or disabling current source 20 from having its current selectively steered to summation node 22 and for connecting calibration component 29 to current source 20. An output bit from shift register 27 controls circuitry 28 for configuring a current source 20 for calibration (FIG. 2A) or for participating in a conversion operations (FIG. 2B). As shown in FIG. 2A, when operably connected to current source 20, the calibration component 29, a reference current source, applies a predetermined charge to a control electrode, such as a gate electrode G, within current source 20 so that current source 20 sources at a predetermined current level Iref. When calibration component 29 is disconnected from current source 20 (FIG. 2B), current source 20 continues to source current Iref for a conversion operation.

First sub-DAC 2 preferably includes at least one more current source 20 and corresponding switching circuit 21 than is necessary to perform a digital-to-analog (D/A) conversion operation. Cyclic shift register 27 sequentially configures a single current source 20 in the calibration mode at a time while concurrently configuring the remaining current sources 20 in the operative mode for performing a conversion operation. Thus, current sources 20 may be calibrated concurrently while first sub-DAC 2 performs a D/A operation.

Second sub-DAC 4 preferably generates a fine current level analog signal equivalent $I_{fine}$ corresponding to the M LSBs of digital input signal 3, i.e., the bits of digital input signal 3 which are not utilized by first sub-DAC 2. Second sub-DAC 4 preferably is partially segmented, including a segmented portion 40 having bits M1 of digital input signal 3 as inputs, wherein M1 is the number of the most significant bits of the M LSBs of digital input signal 3 not within the N MSBs. Segmented portion 40 includes a plurality of equally sized current sources 41.

Segmented portion 40 of second sub-DAC 4 further includes a plurality of switching circuits 42, each of which is connected to a distinct current source 41. Switching circuits 42 are controllable to selectively steer the currents sourced by current sources 41 to either a summation node 43 or to a reference supply 50, such as ground, based upon the binary value of each of the bits of digital input signal 3 which feed segmented portion 40 of second sub-DAC 4. In this case, there are $2^{M1}-1$ equally sized current sources 41 in segment portion 40 of second sub-DAC 4.

Thermometer decoder 44 is included in segmented portion 40 of second sub-DAC 4, receives the M1 bits of digital input signal 3 and generates thermometer decoded signals 45. Each thermometer decoded signal 45 controls a distinct switching circuit 42 (via latches 46a) so that the current sourced by the corresponding current source 41 is selectively steered to summation node 43 based upon the value of the thermometer decoded signal 45. In this way, segmented portion 40 of second sub-DAC 4 generates one of a plurality of discrete fine current levels at summation node 43 based upon the digital input of thermometer decoder 44.

Second sub-DAC 4 preferably further includes latches 46 which temporarily store the M least significant bits of digital input signal 3 that feed the second sub-DAC 4.

Second sub-DAC 4 further includes binary-weighted portion 47 which receives the M2 least significant bits of digital input signal 3 (via latches 46 and latches 46b) and generates a fine current level analog representation thereof. Binary-weighted portion 47 includes a plurality of binary-weighted current sources 48 and switching circuits 49 operatively associated therewith which are each directly controlled by an M2 LSB of digital input signal 3. Switching circuitry 49 selectively steers current flowing through current sources 48 between summation node 43 or reference node 50. The current $I_{fine}$ which is generated by segmented portion 40 and binary weighted portion 47 of second sub-DAC 4 based upon the M LSBs of digital input signal 3 is accumulated at summation node 43 and is an analog current representation of the M LSBs of digital input signal 3 not within the N MSBs thereof.

The current level $I_{coarse}$ generated by first sub-DAC 2 based upon the N MSBs of digital input signal 3 and the current level $I_{fine}$ generated by second sub-DAC 4 based upon the M LSBs thereof are preferably added together by summing circuit 5. Summation nodes 22A (having current $I_{coarse}$ generated by first sub-DAC 2) and 43 (having current $I_{fine}$ generated by second sub-DAC 4) are connected to a first input 51 of summing circuit 5. Reference nodes 22B and 50 are connected to a second input 52 of summing circuit 5. Summing circuit 5 converts the summed current levels generated by first sub-DAC 2 and second sub-DAC 4 into a voltage level which is the analog equivalent of digital input signal 3. In a preferred embodiment of the present invention, summing circuit 5 includes an operational amplifier 53 having one or more feedback resistors 54.

In a preferred embodiment of the present invention, DAC 1 is a 14 bit DAC having first sub-DAC 2 receiving the four MSBs of digital input signal 3, segmented portion 40 of second sub-DAC 4 receiving the next six MSBs thereof, and binary weighted portion 47 receiving the four LSBs of digital input signal 3.

By employing a segmented first sub-DAC 2 having calibration circuitry 29 with a partially segmented second sub-DAC 4, the present invention achieves a relatively high dynamic range at reduced power and chip area.

Figure 3:
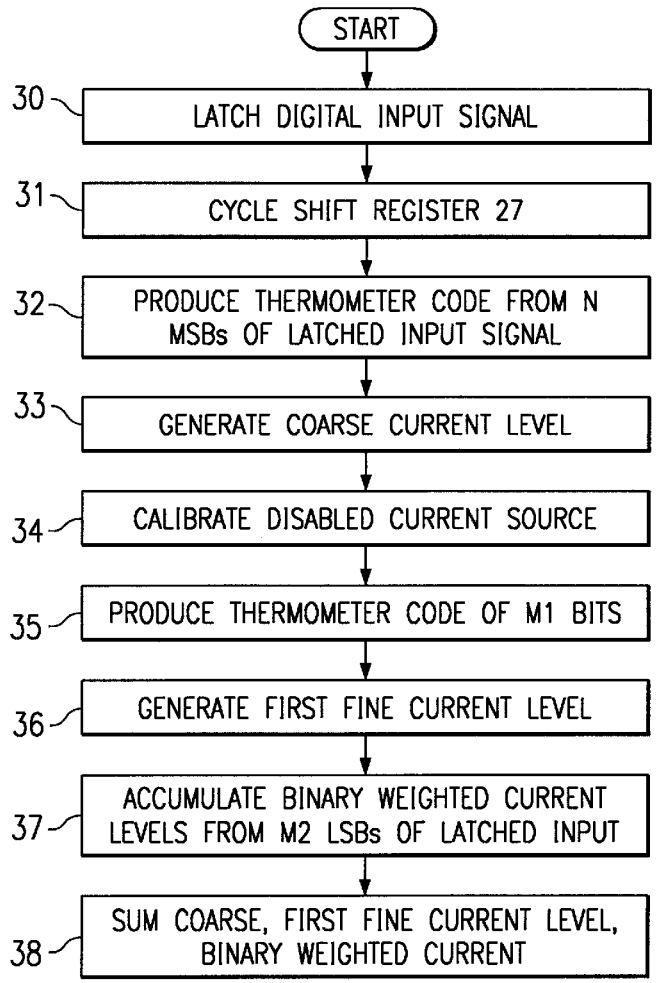
FIG. 3 is a flow diagram illustrating an operation of the present digital-to-analog converter shown in FIG. 1.

The operation of DAC 1 according to the present invention will be described with reference to FIG. 3. Initially, digital input signal 3 is latched into latches 25a and 46 at step 30. Next, cyclic shift register 27 is clocked or shifted at step 31 one time to disable the appropriate single current source 20 of first sub-DAC 2 while enabling the remaining current sources 20 to participate in the conversion operation. Decoders 23 decode the latched N MSBs of digital input signal 3 at step 32, which controls switching circuitry 21 to generate the coarse current level $I_{coarse}$ at step 33. At the same time, the disabled single current source 20 is calibrated at step 34. Thermometer decoder 44 decodes at step 35 the latched M1 MSBs which are not input to thermometer decoder 23. The decoded and latched signals 45 control switching circuitry 42 to generate a first fine current level at step 36. Further, the M2 LSBs of the twice latched digital input signal 3 control switching circuitry 49 at step 37 to accumulate binary weighted current levels, which are combined with the first fine current level to generate fine current level $I_{fine}$. The coarse current level $I_{coarse}$ and the fine current level $I_{fine}$ are summed by summing circuitry 5 at step 38 to generate an analog voltage equivalent of digital input signal 3.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A digital-to-analog converter (DAC) for converting a digital input signal into a signal in analog form, comprising:
   a first sub-DAC, controlled by a plurality of most significant bits of the digital input signal, for generating one of a number of coarse current levels;
   a second sub-DAC, controlled by bits of the digital input signal other than the plurality of most significant bits thereof, for generating one of a number of fine current levels; and
   summing circuitry for adding the coarse current level generated by the first sub-DAC with the fine current level generated by the second sub-DAC;
   wherein the second sub-DAC is partially segmented.

2. The digital-to-analog converter of claim 1, wherein:
   the second sub-DAC includes a first circuit portion having a segmented architecture and a second circuit portion having a binary-weighted architecture.

3. The digital-to-analog converter of claim 2, wherein:
   the first circuit portion is responsive to a majority of the bits of the digital input signal which do not control the first sub-DAC.

4. The digital-to-analog converter of claim 2, wherein the first circuit portion of the second sub-DAC includes:
   a plurality of equally-sized current sources; and
   a decoder which decodes the most significant bits of the digital input signal which do not control the first sub-DAC, for selectively steering the equally-sized current sources to a summation node input to the summing circuitry.

5. The digital-to-analog converter of claim 1, wherein:
   the second sub-DAC includes storage elements for temporarily storing bits of the digital input signal which do not control the first sub-DAC.

6. The digital-to-analog converter of claim 1, wherein:
   the first sub-DAC has a segmented architecture.

7. The digital-to-analog converter of claim 6, wherein the first sub-DAC includes:
   a plurality of equally-sized current sources; and
   trim circuitry for sequentially self-calibrating the equally-sized current sources while the first sub-DAC performs a conversion operation.

8. The digital-to-analog converter of claim 7, wherein:
   the number of equally-sized current sources in the first sub-DAC is at least one more than necessary to perform a converter operation; and
   the trim circuitry includes a cyclic shift register which sequentially disables the equally-sized current sources and enables the equally-sized current sources other than the disabled equally-sized current source for performing a converter operation.

9. The digital-to-analog converter of claim 6, wherein the first sub-DAC includes:
   a plurality of equally-sized current sources; and
   decoders having inputs which are driven by the plurality of most significant bits of the digital input signal and decoded output signals which selectively steer current flowing through the equally-sized current sources towards a summation node input to the summing circuit.

10. The digital-to-analog converter of claim 1, wherein:
    the first sub-DAC includes a plurality of storage elements for temporarily storing the plurality of most significant bits of the digital input signal.

11. A method of converting a digital signal having N+M bits, wherein N and M are integers, to an analog signal equivalent, the method comprising the steps of:

generating a coarse current level proportional to the most significant N bits of the digital signal;

producing a thermometer code equivalent from a first set of bits of the M least significant bits of the digital signal;

generating a first fine current level based upon the thermometer code equivalent of the first set of bits of the M least significant bits of the digital signal;

generating a second fine current level based upon a second set of bits of the M least significant bits of the digital signal, the first and second sets of bits totaling the M least significant bits of the digital signal; and adding the coarse current level, the first fine current level and the second fine current level to produce the analog signal equivalent.

12. The method of claim 11, wherein the step of generating a first fine current level comprises the step of:

accumulating a number of equally-sized current levels to produce the first fine current level, the number of equally-sized current levels being based upon the binary value of the bits of a thermometer code equivalent of the first set of bits of the M least significant bits of the digital signal.

13. The method of claim 11, wherein the step of generating a second fine current level comprises the step of:

accumulating binary-weighted current levels based upon the second set of bits of the M least significant bits of the digital signal to produce the second fine current level.

14. The method of claim 11, wherein the step of generating a coarse current level comprises the step of:

producing a code equivalent from the N most significant bits of the digital signal;

accumulating a number of equally-sized current levels to produce the coarse current level, the number of equally-sized current levels being based upon the value of the bits of the code equivalent of the N most significant bits of the digital signal.

15. The method of claim 14, wherein:

the step of accumulating a number of equally-sized current levels comprises the step of selectively steering each of the equally-sized current levels from a distinct current source to an accumulation node; and the method further includes the step of sequentially calibrating the current sources.

16. The method of claim 15, wherein the step of sequentially calibrating comprises the step of:

sequentially temporarily disabling each current source from performing in the step of accumulating a number of equally-sized current levels.

17. The method of claim 16, wherein the step of calibrating further comprises the step of:

trimming the disabled current source to substantially match the performance of other of the current sources.

18. An apparatus for producing an analog signal equivalent from a digital signal having N+M bits, wherein N and M are integers, comprising:

a first digital-to-analog converter (DAC) portion for generating a coarse current level analog equivalent of the N most significant bits of the digital signal;

a second DAC portion for generating a fine current level analog equivalent of the M least significant bits of the digital signal, the second DAC portion being a partially segmented DAC portion; and a summing circuit for adding the coarse current level analog equivalent and the fine current level analog equivalent to produce the analog signal equivalent.

19. The apparatus of claim 18, wherein:

the first DAC portion is a segmented DAC portion.

20. The apparatus of claim 19, wherein:

the first DAC portion includes a plurality of current sources and calibration circuitry for automatically calibrating the current sources concurrently with the first DAC portion generating the coarse current level analog equivalent.

21. The apparatus of claim 20, wherein:

the number of current sources in the first DAC portion exceeds a number of current sources necessary to generate the coarse current level analog equivalent; and the calibration circuitry comprises a cyclic shift register which sequentially disables a current source for calibration while enabling the remaining current sources to generate the coarse current level analog equivalent.

22. The apparatus of claim 18, wherein the second DAC portion comprises:

a thermometer decoder for generating a plurality of decoded signals from the most significant bits of the M least significant bits of the digital signal;

a plurality of equally-sized current sources, each current source corresponding to a distinct bit of the decoded signal; and circuitry for accumulating current flowing through the equally-sized current sources at the summing circuit based upon the binary values of the decoded signals.

23. The apparatus of claim 22, wherein the second DAC portion further comprises:

a plurality of binary-weighted current sources; and circuitry for accumulating current flowing through the binary-weighted current sources at the summing circuit based upon the binary values of the least significant bits of the M least significant bits of the digital signal.

24. An apparatus for producing an analog signal equivalent from a digital signal having N+M bits, wherein N and M are integers, comprising:

first means for generating a coarse current level analog equivalent of the N most significant bits of the digital signal;

a partially segmented DAC portion for generating a fine current level analog equivalent of the M least significant bits of the digital signal; and second means for adding the coarse current level analog equivalent and the fine current level analog equivalent to produce the analog signal equivalent.

25. The apparatus of claim 24, wherein the partially segmented DAC portion comprises:

a thermometer decoder for generating a plurality of decoded signals from the most significant bits of the M least significant bits of the digital signal;

a plurality of equally-sized current sources, each current source corresponding to a distinct bit of the decoded signal; and circuitry for accumulating current flowing through the equally-sized current sources at the second means based upon the binary values of the decoded signals.

26. The apparatus of claim 25, wherein the partially segmented DAC portion further comprises:

a plurality of binary-weighted current sources; and circuitry for accumulating current flowing through the binary-weighted current sources at the second means based upon the binary values of the least significant bits of the M least significant bits of the digital signal.

27. An apparatus for producing an analog signal equivalent from a digital signal having N+M bits, wherein N and M are integers, comprising:

a first digital-to-analog converter (DAC) portion for generating a coarse current level analog equivalent of the N most significant bits of the digital signal;

a second DAC portion for generating a fine current level analog equivalent of the M least significant bits of the digital signal, the second DAC portion having a partially segmented architecture; and a summing circuit for adding the coarse current level analog equivalent and the fine current level analog equivalent to produce the analog signal equivalent.

* * * * *